United States Patent [19]

Hua et al.

[11] Patent Number: 4,808,273

[45] Date of Patent: Feb. 28, 1989

[54] METHOD OF FORMING COMPLETELY METALLIZED VIA HOLES IN SEMICONDUCTORS

[75] Inventors: Chang-Hwang Hua, Palo Alto; Ding-Yuan S. Day, Sunnyvale; Simon S. Chan, Belmont, all of Calif.

[73] Assignee: Avantek, Inc., Santa Clara, Calif.

[21] Appl. No.: 192,343

[22] Filed: May 10, 1988

[51] Int. Cl.⁴ ............................................. C25D 5/02
[52] U.S. Cl. .................................................. 204/15
[58] Field of Search ........................ 204/15, 38.1, 38.4

[56] References Cited

U.S. PATENT DOCUMENTS

| | | | |
|---|---|---|---|
| 3,323,198 | 6/1967 | Shortes | 29/460 |
| 3,484,341 | 12/1969 | Devitt | 204/15 |
| 3,562,009 | 2/1971 | Cranston et al. | 427/43.1 |
| 4,089,992 | 5/1978 | Doo et al. | 427/94 |
| 4,153,988 | 5/1979 | Doo | 29/626 |
| 4,211,603 | 7/1980 | Reed | 156/659.1 |
| 4,348,253 | 9/1982 | Subbarao et al. | 156/643 |
| 4,403,241 | 9/1983 | Butherus et al. | 357/55 |
| 4,426,767 | 1/1984 | Swanson et al. | 29/571 |
| 4,467,521 | 8/1984 | Spooner et al. | 29/576 E |
| 4,512,829 | 4/1985 | Ohta et al. | 156/659.1 |

Primary Examiner—T. M. Tufariello
Attorney, Agent, or Firm—Limbach, Limbach & Sutton

[57] ABSTRACT

A method is disclosed for forming completely metallized via holes in semiconductor wafers. Metal pads are formed on one face of a semiconductor wafer together with a conductive interconnecting network. An insulating layer is then deposited to cover this face of the wafer. Holes are etched in the opposite face of the wafer up to and exposing a portion of the metal pads. The via holes are then completely filled with metal by means of electroplating, using the metal pads as a cathode.

17 Claims, 1 Drawing Sheet

METHOD OF FORMING COMPLETELY METALLIZED VIA HOLES IN SEMICONDUCTORS

FIELD OF THE INVENTION

This invention relates to the field of semiconductor electronic devices and integrated circuits. More precisely, a process is disclosed for forming completely metallized via holes through a semiconductor wafer.

BACKGROUND OF THE INVENTION

Many applications exist for metallized through-holes in semiconductor wafers. Referring to FIG. 1, in a prior art method for forming metallized vias, metal pads 122 are formed on the first side of a wafer 120 as part of a circuit pattern and holes 124 are etched through the wafer 120 from the second side so that the holes 124 expose a portion of the underside of the pads 122. A conductive metal layer 123 is then deposited to coat the inside of the hole and the surrounding area with metal using ordinary semiconductor processing techniques, such as sputtering or electroless plating. This structure is then electroplated using the metal pads 122 and deposited layer 123 as a cathode to fill up the remainder of the via hole and form a layer 125.

During the electroplating, the higher electric field at the corners where the vertical walls of the holes intersect the horizontal surface of the wafer 120 results in higher current densities and therefore higher plating rates. There are distinct disadvantages that result from this higher electric field. The electroplated metal is deposited more rapidly in regions of higher electric field. As a result, the top of the hole 124 fills in more rapidly than its bottom. Eventually the opening of the hole will close before the bottom of the hole has filled in creating an unmetallized cavity 127 inside of the via. Further, bumps 129 are formed on the surface of the wafer surrounding the holes due also to the higher electric field in these regions.

In another technique proposed by Subbarao, et al., U.S. Pat. No. 4,348,253, the holes used as vias are not terminated by metal pads. Circuit patterns are formed on the front side of the semiconductor wafer. A precision laser then drills the holes one at a time from the front side of the wafer. Because each hole in the wafer must be individually drilled significant processing time is required. Localized heating from the laser may create surface and structural damages within the semiconductor material.

The wafer is then metallized on the backside and mounted on an electroplating block using an insulating adhesive layer. Subsequent electroplating using the backside metallization as a cathode fills the vias from the backside of the wafer. It is possible for a void to be formed in the via hole adjacent to the adhesive layer.

Examples of other techniques of forming metallized vias can be found in the following U.S. Patents. In U.S. Pat. No. 3,562,009 a laser beam is used to drill a hole through a wafer and a metal structure on the surface of the wafer. The drilling vaporizes the metal which becomes deposited on the inner surfaces of the hole. In U.S. Pat. No. 3,323,198 a similar technique to the U.S. Pat. No. 3,562,009 is used with a high energy electron beam.

In U.S. Pat. Nos. 4,512,829, and 4,211,603 techniques are disclosed for forming plated through-holes in printed circuit boards and multi-layer printed circuit boards. In U.S. Pat. No. 4,153,988 a technique is disclosed for forming plated through holes in packages for integrated circuits. In U.S. Pat. No. 3,484,341 a technique is disclosed for forming aluminum contacts in integrated circuits which partially penetrate a semiconductor wafer.

It is an object of the present invention to provide completely metallized vias for a semiconductor wafer without voids, cavities or surface bumps.

It is a further object of the invention to provide completely metallized vias with a simple process flow.

It is yet another object of the invention to provide completely metallized vias terminated by metal pads which are not through-etched.

SUMMARY OF THE INVENTION

The above and other objects are achieved by the present invention of a method of forming completely metallized via holes in a semiconductor wafer comprising the steps of forming metallic pads interconnected by a conductive network on a first face of the wafer and forming an insulation layer over the face of the wafer. Holes are then etched from the other face of the wafer such that they terminate on the metal pads on the first face. The wafer is then electroplated using the metal pads as the cathode. Since the plating current flows predominantly through the metal pads, the holes are filled up evenly with plated metal. Plating on the first surface of the wafer is prevented by the insulating layer.

The foregoing and other objectives, features and advantages of the invention will be more readily understood upon consideration of the following detailed description of certain preferred embodiments of the invention, taken in conjunction with the accompanying drawings.

DETAILED DESCRIPTION OF THE PREFERRED EMBODIMENT

The process of the present invention is shown step by step in FIGS. 2 through 5. These figures represent the cross-section of a wafer being processed pursuant to the present invention and are shown after each key step in the process. Identical elements are shown with the same numbers in sequential steps. A modified element, changed for example by etching, is shown by the same number with an alphabetic suffix.

Figure 1:
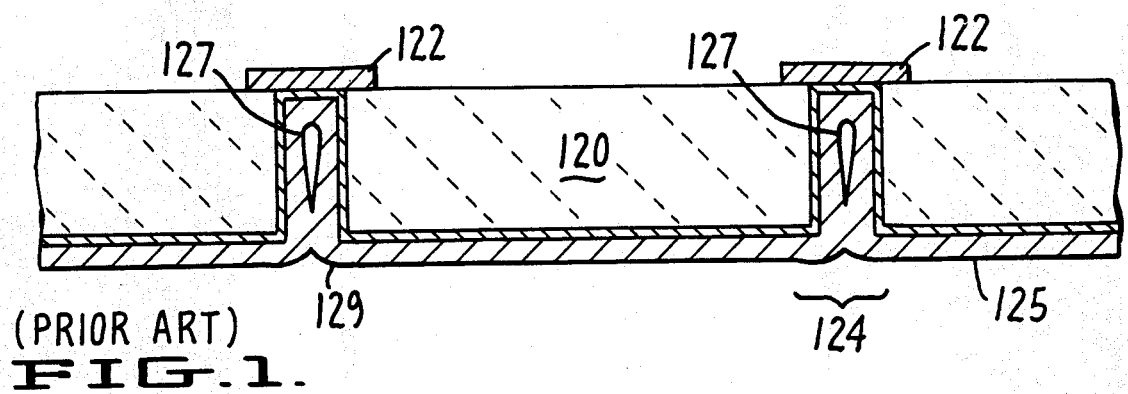
FIG. 1 is a sectional view of a metallized via-hole formed by a prior art method.
Figure 2:
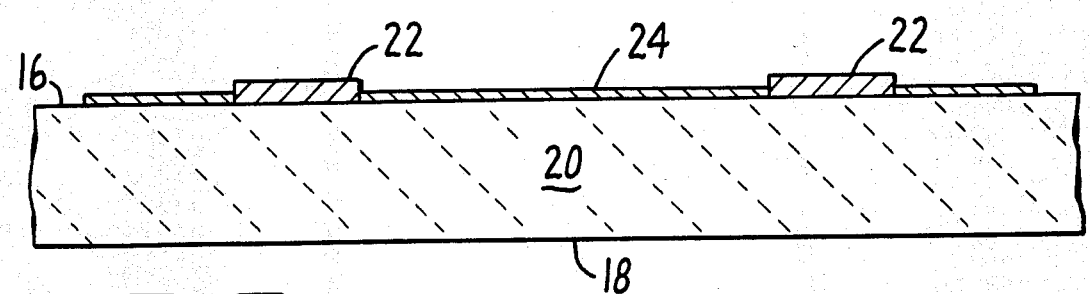
FIGS. 2 through 5 are sectional views of a semiconductor wafer illustrating the process sequence of the present invention.

FIG. 2 shows the cross-section of a semiconductor wafer 20 commonly used in conventional semiconductor technologies, such as Si or GaAs, having a first face 16 and a second face 18. In the first step of the process, metal pads 22 interconnected by a conductive metal network 24 are formed on the first face 16 by conventional processing techniques such as, but not limited to, vacuum evaporation in conjunction with photoresist lift-off.

Figure 3:
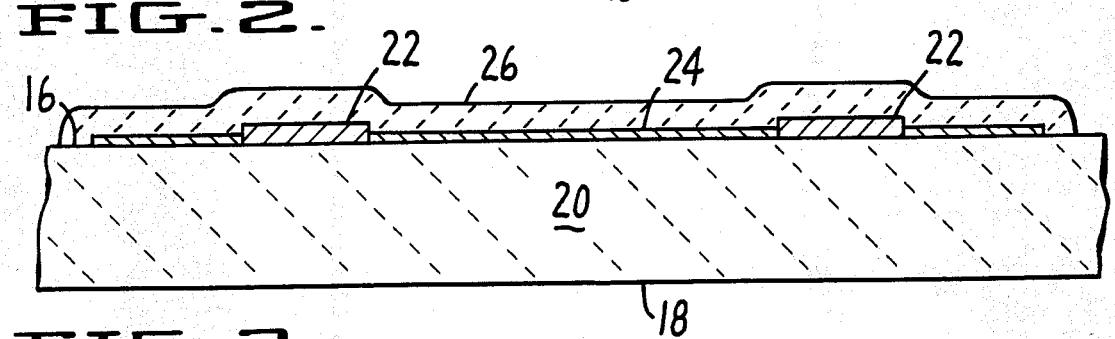

In the second step of the process, as shown in FIG. 3, an electrically insulating, as well as chemically inert (as far as subsequent steps are concerned), layer 26 is deposited on face 16 of the wafer 20 to protect it from alteration during the rest of the process. In the preferred embodiment wax is chosen for this step because of its ease of removal at the end of the process.

Figure 4:
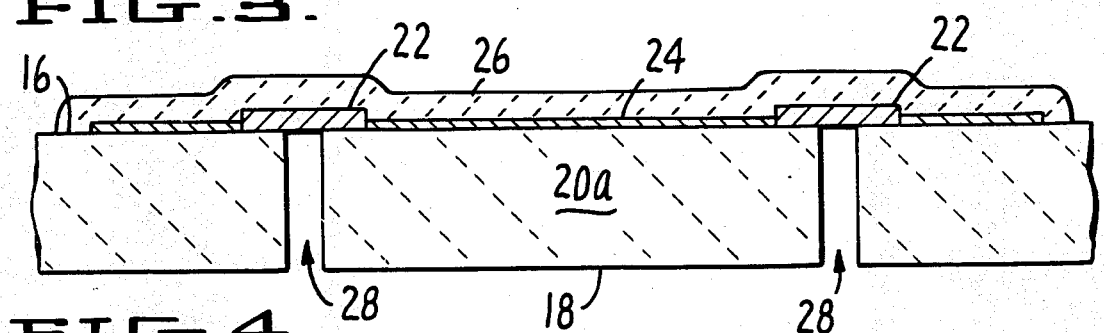

In the third step of the process, as shown in FIG. 4, holes 28 are etched through the wafer 20 from face 18 forming the modified wafer 20a. The holes 28 are formed immediately underneath the pads 22. The holes 28 completely penetrate the wafer 20a and expose at least a portion of the bottom of each of the pads 22. Via-holes 28 can be preferably reactive ion etched from the surface 18 completely through the wafer so that the via-holes 28 extend from the surface 18 to the surface 16, exposing a part of the bottom surfaces of metal pads 22. In less desirable embodiments the via-holes can be wet-chemical etched, but this will lead to graded side walls. As a result, the via-hole spacing must be large enough to allow for the side wall grading.

Figure 5:
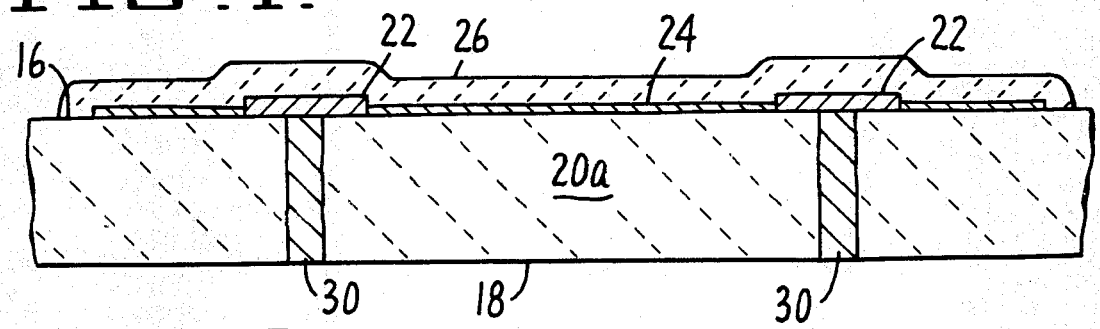

At this point, the modified wafer 20a is immersed in an electroplating, preferably gold, solution and the interconnected pads 22 ar made the cathode. Actual physical connection of the interconnected pads 22 to the negative terminal of a battery or equivalent dc power supply may be achieved by the use of a probe of appropriate size through one of the holes 28. Alternatively, a small area of the insulating layer 26, preferably near the edge of the wafer 20a may be selectively removed to expose some of the metals pads 22 for electrical connection. Electrical current through this electroplating set-up passes predominantly through the interconnected pads 22 but not through the semiconductor material in wafer 20a because of conductivity differences. The anode can be of any material compatible with the electroplating solution. With the proper electroplating current and sufficient time, completely metallized vias 30 are formed as shown in FIG. 5, with no internal voids or external bumps or irregularities on the wafer surface 18 surrounding the vias. The insulating layer 26 may then be removed if necessary.

An improved process is disclosed for creating metallized via holes in an easy to implement fashion without voids or cavities in the vias or irregularities and bumps on the wafer surface surrounding the via holes.

Although the present invention has been shown and described with respect to preferred embodiments, various changes and modifications which are obvious to a person skilled in the art to which the invention pertains are deemed to lie within the spirit and scope of the invention.

What is claimed is:

1. A method for forming metallized via holes in a semiconductor wafer having first and second sides comprising the steps of:
    (a) forming electrically interconnected conductive pads on said first side of said wafer;
    (b) forming holes through said wafer from said second side to said first side, in alignment with said conductive pads, to thereby expose the underside of said pads;
    (c) electroplating the interior surfaces of said holes, using said interconnected pads as a cathode.

2. The method according to claim 1 further comprising the step of forming an insulating layer over said first side of said wafer and said interconnected pads prior to said electroplating step.

3. The method according to claim 2 wherein said step of forming an insulating layer comprises covering over with wax said first side of said wafer and said interconnected pads prior to said electroplating step.

4. The method according to claim 2 wherein said step of forming said hole comprises reactive ion etching said hole.

5. A method for forming one or more metallized via holes in a semiconductor wafer having a first side and a second side comprising the steps of:
    (a) forming at least one conductive pad on said first side, said pad having a top surface and a bottom surface, said bottom surface facing the first side of the wafer;
    (b) forming an insulating layer over said first side of said wafer and said pad;
    (c) forming at least one hole through said wafer from said second side to said first side, said hole exposing at least a portion of the bottom surface of said pad;
    (d) electroplating to fill the entire volume of said hole with conductive material using said pad as the cathode.

6. The method according to claim 5 further comprising the step of selectively removing a portion of said insulating layer, prior to said electroplating step, to expose a region of said pad for making electrical contact during the electroplating step.

7. The method according to claim 5 wherein the electroplating step further comprises making electrical contact to said pad by contacting said pad with a probe through said hole to thereby use said pad as the cathode for electroplating.

8. The method according to claim 5 wherein said step of forming an insulating layer comprises covering over with wax said first side of said wafer and said pad prior to said electroplating step.

9. The method according to claim 5 wherein said step of forming said holes comprises reactive ion etching said holes.

10. A method for forming completely metallized via holes in a semiconductor wafer having a first side and a second side comprising the steps of:
    (a) selectively depositing interconnected, conductive pads on said first side;
    (b) forming an insulating layer over said first side of said wafer and over said pads and said interconnections;
    (c) forming holes through said wafer to said pads, said holes exposing at least a portion of the surfaces of said pads which face the wafer;
    (d) filling said holes with conductive material by electroplating while using said pads and said interconnections as a cathode.

11. The method according to claim 10 wherein the electroplating step further comprises selectively removing a region of said insulating layer and then making electrical contact to said interconnected pads to allow the interconnected pads to be used as the cathode for electroplating.

12. The method according to claim 10 wherein the electroplating step further comprises making electrical, cathode contact to said interconnected pads by contacting at least one of said pads with a probe through an appropriate one of said holes.

13. The method according to claim 10 wherein said step of forming an insulating layer comprises covering over with wax said first side of said wafer and said interconnected pads prior to said electroplating step.

14. The method according to claim 10 wherein said step of forming said holes comprises reactive ion etching said holes.

15. The method according to claim 1 wherein said electroplating step comprises filling said holes with gold.

16. The method according to claim 5 wherein said electroplating step comprises filling said holes with gold.

17. The method according to claim 10 wherein said electroplating step comprises filling said holes with gold

* * * * *